(12) United States Patent
Kim (10) Patent No.: US 10,978,432 B2
(45) Date of Patent: Apr. 13, 2021

(54) SEMICONDUCTOR PACKAGE (71) Applicant: SAMSUNG ELECTRONICS CO., LTD., Suwon-si (KR)

(72) Inventor: Kilsoo Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 9 days.

(21) Appl. No.: 16/419,782

(22) Filed: May 22, 2019

(65) Prior Publication Data

US 2019/0378826 A1    Dec. 12, 2019

(30) Foreign Application Priority Data

Jun. 11, 2018 (KR) .................. 10-2018-0066715

(51) Int. Cl.
| | | |
|---|---|---|
| H01L 25/10 | (2006.01) |
| H01L 23/00 | (2006.01) |
| H01L 23/31 | (2006.01) |
| H01L 21/48 | (2006.01) |
| H01L 21/56 | (2006.01) |
| H01L 25/00 | (2006.01) |
| H01L 21/78 | (2006.01) |

(52) U.S. Cl.
CPC ........ *H01L 25/105* (2013.01); *H01L 21/4853* (2013.01); *H01L 21/565* (2013.01); *H01L 21/78* (2013.01); *H01L 23/3128* (2013.01); *H01L 24/73* (2013.01); *H01L 25/50* (2013.01); *H01L 2224/73257* (2013.01); *H01L 2225/1023* (2013.01); *H01L 2225/1041* (2013.01); *H01L 2225/1058* (2013.01); *H01L 2924/19105* (2013.01)

(58) Field of Classification Search
None
See application file for complete search history.

(56) References Cited

U.S. PATENT DOCUMENTS

| | | | |
|---|---|---|---|
| 8,035,235 B2 | 10/2011 | Jang et al. | |
| 8,378,477 B2 | 2/2013 | Do et al. | |
| 8,399,992 B2 * | 3/2013 | Park | H01L 23/3128 257/777 |
| 8,525,349 B2 | 9/2013 | Song et al. | |
| 8,796,861 B2 | 8/2014 | Kim et al. | |

(Continued)

FOREIGN PATENT DOCUMENTS

KR    10-1594492 B1    2/2016

*Primary Examiner* — Long Pham
(74) *Attorney, Agent, or Firm* — Lee IP Law, PC (57) ABSTRACT

A semiconductor package includes a first semiconductor package, a second semiconductor package on the first semiconductor package, and a plurality of connection terminals between the first semiconductor package and the second semiconductor package. The first semiconductor package may include a package substrate, a semiconductor chip on the package substrate and having a first surface and a second surface facing each other, the first surface being adjacent to the second semiconductor package, a plurality of connection pads between the first surface of the semiconductor chip and the connection terminals, and a molding layer on the package substrate and covering side surfaces of the semiconductor chip, the molding layer being spaced apart from the connection terminals.

20 Claims, 8 Drawing Sheets

(56) References Cited

U.S. PATENT DOCUMENTS

| | | | |
|---|---|---|---|
| 8,916,875 B2* | 12/2014 | Lee | H01L 23/49838 |
| | | | 257/48 |
| 9,171,792 B2 | 10/2015 | Sun et al. | |
| 2012/0248439 A1* | 10/2012 | Lee | H01L 23/49838 |
| | | | 257/48 |
| 2014/0252561 A1 | 9/2014 | Lisk et al. | |
| 2015/0130078 A1* | 5/2015 | Hong | H01L 23/3128 |
| | | | 257/774 |
| 2015/0206865 A1 | 7/2015 | Yu et al. | |
| 2015/0206866 A1 | 7/2015 | Yu et al. | |
| 2017/0040303 A1 | 2/2017 | Yoo et al. | |

\* cited by examiner

SEMICONDUCTOR PACKAGE

CROSS-REFERENCE TO RELATED APPLICATION

Korean Patent Application No. 10-2018-0066715, filed on Jun. 11, 2018 in the Korean Intellectual Property Office, and entitled: "Semiconductor Package," is incorporated by reference herein in its entirety.

BACKGROUND

1. Field

Embodiments relate to a semiconductor package.

2. Description of the Related Art

Semiconductor devices are widely used in the electronic industry because of their small size, multi-functionality, and/or low manufacturing cost. Semiconductor devices may encompass memory devices for storing data, logic devices for processing data, and hybrid devices for performing various functions simultaneously.

Semiconductor devices have been increasingly required for high integration with the advanced development of the electronic industry. Semiconductor devices also have been increasingly requested for high speed with the advanced development of the electronic industry.

SUMMARY

Embodiments are directed to a semiconductor package, including a first semiconductor package, a second semiconductor package on the first semiconductor package, and a plurality of connection terminals between the first semiconductor package and the second semiconductor package. The first semiconductor package may include a package substrate, a semiconductor chip on the package substrate and having a first surface and a second surface facing each other, the first surface being adjacent to the second semiconductor package, a plurality of connection pads between the first surface of the semiconductor chip and the connection terminals, and a molding layer on the package substrate and covering side surfaces of the semiconductor chip, the molding layer being spaced apart from the connection terminals.

Embodiments are also directed to a semiconductor package, including a first semiconductor package, a second semiconductor package on the first semiconductor package, and a plurality of connection terminals between the first semiconductor package and the second semiconductor package. The first semiconductor package may include a package substrate, a semiconductor chip on the package substrate and having a first surface and a second surface facing each other, a plurality of chip terminals between the package substrate and the second surface of the semiconductor chip, and a plurality of connection pads between the first surface of the semiconductor chip and the connection terminals. The semiconductor chip may includes a first part on which the connection pads are disposed, and a second part between the first part and a side surface of the semiconductor chip, the second part of the semiconductor chip being recessed from the first surface of the first part of the semiconductor chip.

BRIEF DESCRIPTION OF THE DRAWINGS

Features will become apparent to those of skill in the art by describing in detail example embodiments with reference to the attached drawings in which.

DETAILED DESCRIPTION

Figure 1:
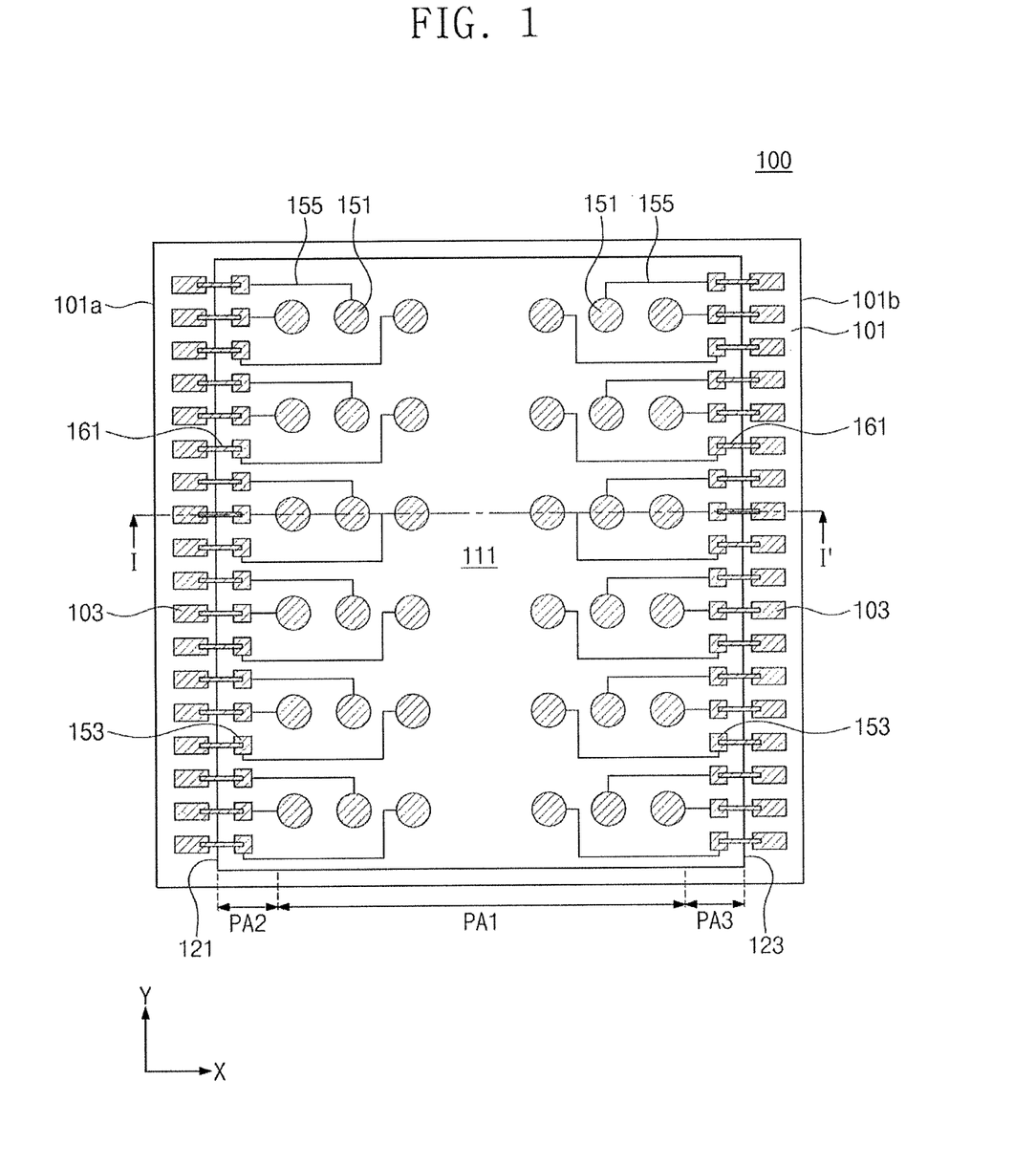
FIG. 1 illustrates a plan view showing a first semiconductor package according to an example embodiment.
Figure 2:
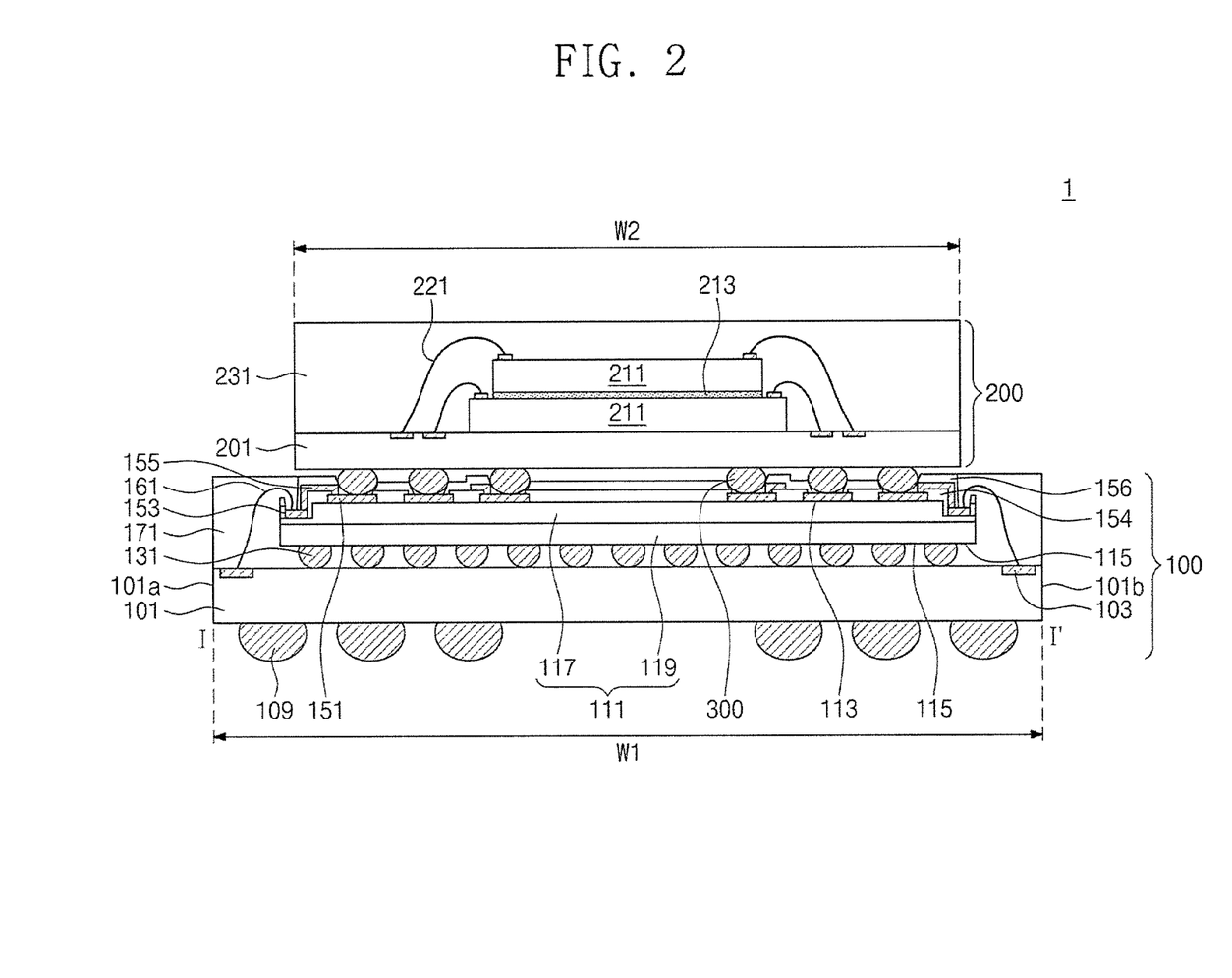
FIG. 2 illustrates a cross-sectional view showing a semiconductor package according to an example embodiment.

FIG. 1 illustrates a plan view showing a first semiconductor package according to an example embodiment. FIG. 2 illustrates a cross-sectional view showing a semiconductor package according to an example embodiment.

Referring to FIGS. 1 and 2, a semiconductor package 1 may include a first semiconductor package 100, a second semiconductor package 200 on the first semiconductor package 100, and connection terminals 300 between the first and second semiconductor packages 100 and 200. The first and second semiconductor packages 100 and 200 may be vertically stacked on each other.

The first semiconductor package 100 may include a first package substrate 101, a first semiconductor chip 111, chip terminals 131, connection pads 151, bonding pads 153, connection patterns 155, first bonding wires 161, and a first molding layer 171.

The first semiconductor chip 111 may be provided on the first package substrate 101. The first package substrate 101 may be or include, for example, a printed circuit board (PCB).

The first package substrate 101 may include first pads 103. The first pads 103 may be used for, e.g., wire bonding. The first pads 103 may be disposed on a top surface of the first package substrate 101. The first pads 103 may be disposed on the top surface of opposite edges of the first package substrate 101. When viewed in plan, as shown in FIG. 1, the first pads 103 may face each other in a first direction X across the first semiconductor chip 111. For example, the first package substrate 101 may have a first side surface 101*a* and a second side surface 101*b* facing each other, and the first pads 103 adjacent to the first side surface 101*a* and the first pads 103 adjacent to the second side surface 101*b* may face each other in the first direction X. The first pads 103 may be linearly arranged in a second direction Y intersecting the first direction X. In another implementation, the first pads 103 may be disposed on the top surface of a perimeter of the first package substrate 101. For example, on the top surface of the first package substrate 101, the first pads 103 may be arranged along four side surfaces of the first package substrate 101.

External terminals 109 may be provided on a bottom surface of the first package substrate 101, which bottom surface is opposite to the top surface of the first package substrate 101. The external terminals 109 may electrically connect the first package substrate 101 to an external apparatus. The external terminals 109 may include, for example, solder bumps or solder balls.

The top surface of the first package substrate 101 with the first semiconductor chip 111 thereon may have exposed first pads 103. The first semiconductor chip 111 may have a first surface 113 and a second surface 115 opposite the first surface 113. The first surface 113 may be adjacent to the second semiconductor package 200, and the second surface 115 may be adjacent to the first package substrate 101.

In an example embodiment, the first surface 113 of the first semiconductor chip 111 may be an inactive surface, and the second surface 115 of the first semiconductor chip 111 may be an active surface. The active surface may be a surface provided thereon with connection terminals (e.g., solder balls or bonding wires) that connect the first semiconductor chip 111 to the first package substrate 101.

The first semiconductor chip 111 may have a first side surface 121 and a second side surface 123 opposite to the first side surface 121. The first side surface 121 of the first semiconductor chip 111 and the first side surface 101a of the first package substrate 101 may be adjacent to each other and parallel to each other. The second side surface 123 of the first semiconductor chip 111 and the second side surface 101b of the first package substrate 101 may be adjacent to each other and parallel to each other.

The first semiconductor chip 111 may include a semiconductor layer 117 and an integrated circuit structure 119. The semiconductor layer 117 may be disposed at a top surface of the integrated circuit structure 119. The first surface 113 of the first semiconductor chip 111 may correspond to a top surface of the semiconductor layer 117, and the second surface 115 of the first semiconductor chip 111 may correspond to a bottom surface of the integrated circuit structure 119. The semiconductor layer 117 may be or include, for example, a silicon layer. The integrated circuit structure 119 may include insulation layers stacked on a bottom surface of the semiconductor layer 117, which bottom surface is opposite to the top surface of the semiconductor layer 117, and also include at least one transistor disposed on the bottom surface of the semiconductor layer 117. The at least one transistor may be a constituent part of a control circuit and/or a power circuit. In an example embodiment, the first semiconductor chip 111 may be a semiconductor logic chip.

The first semiconductor chip 111 may include a first part PA1, a second part PA2 on one side of the first part PA1, and a third part PA3 on an opposite side of the first part PA1, and first part PA1 may be between the second part PA2 and the third part PA3. The second part PA2 may be between the first side surface 121 of the first semiconductor chip 111 and a sidewall of the first part PA1. The third part PA3 may be between the second side surface 123 of the first semiconductor chip 111 and an opposite sidewall of the first part PA1. The second and third parts PA2 and PA3 may be recessed from the first surface 113 of the first part PA1. For example, relative to the second surface 115 of the first semiconductor chip 111, the first surface 113 of each of the second and third parts PA2 and PA3 may be closer than the first surface 113 of the first part PA1 to the second surface 115 of the first semiconductor chip 111.

The chip terminals 131 may be provided between the first package substrate 101 and the second surface 115 of the first semiconductor chip 111. The chip terminals 131 may be electrically connected to the at least one transistor on the bottom surface of the semiconductor layer 117. The chip terminals 131 may connect the first semiconductor chip 111 to the first package substrate 101. For example, the chip terminals 131 may connect the first semiconductor chip 111 to the external terminals 109. The chip terminals 131 may be or include, for example, solder balls.

The connection pads 151 may be provided on the first surface 113 of the first semiconductor chip 111. For example, the connection pads 151 may be disposed on the first surface 113 of the first part PA1 of the first semiconductor chip 111. The connection pads 151 may be spaced apart from each other in the first and second directions X and Y.

The bonding pads 153 may be provided on the first surface 113 of each of the second and third parts PA2 and PA3 of the first semiconductor chip 111. The bonding pads 153 may be linearly arranged in the second direction Y. In another implementation, the bonding pads 153 may be disposed on the first surface 113 along a perimeter of the first semiconductor chip 111.

A first insulation layer 154 may be provided on the first surface 113 of the first semiconductor chip 111. The first insulation layer 154 may expose the connection pads 151 and the bonding pads 153. The first insulation layer 154 may be formed of a single layer or a plurality of layers. The first insulation layer 154 may include, for example, one or more of a silicon oxide layer, a silicon nitride layer, and a silicon oxynitride layer.

The connection patterns 155 may be provided on the first surface 113 of the first semiconductor chip 111. For example, the connection patterns 155 may be disposed on the first insulation layer 154. The connection patterns 155 may be spaced apart from each other. The connection patterns 155 may be disposed to correspond to the connection pads 151 and may extend toward the bonding pads 153. For example, the connection pattern 155 may have one end in contact with one of the connection pads 151 and another end in contact with one of the bonding pads 153, and one connection pattern 155 may electrically connect one connection pad 151 to one bonding pad 153. Each of the connection patterns 155 may include a single metal layer or a plurality of metal layers. Each of the connection patterns 155 may include, for example, one or more of aluminum (Al), nickel (Ni), and copper (Cu).

A second insulation layer 156 may be provided on the first insulation layer 154. The second insulation layer 156 may cover the connection patterns 155 disposed on the first insulation layer 154. The second insulation layer 156 may expose the connection pads 151 and the bonding pads 153. The second insulation layer 156 may be formed of a single layer or a plurality of layers. The second insulation layer 156 may include, for example, one or more of a silicon oxide layer, a silicon nitride layer, and a silicon oxynitride layer.

The first bonding wires 161 may be provided between the first package substrate 101 and the first surface 113 of the first semiconductor chip 111. The first bonding wires 161 may be disposed on the second and third parts PA2 and PA3 of the first semiconductor chip 111. The first bonding wires 161 may be arranged in the second direction Y. Each of the first bonding wires 161 may be disposed between one bonding pad 153 and one first pad 103. The first bonding wires 161 may electrically connect the bonding pads 153 to the first pads 103. The first bonding wires 161 may be connected to the connection pads 151 through the bonding pads 153 and the connection patterns 155.

The first molding layer 171 may be provided on the first package substrate 101. The first molding layer 171 may fill a space between the first package substrate 101 and the second surface 115 of the first semiconductor chip 111. The first molding layer 171 may cover the first bonding wires 161 and side surfaces of the first semiconductor chip 111. The first molding layer 171 may have a top surface coplanar with that of the second insulation layer 156. The first molding layer 171 may vertically overlap the second and third parts PA2 and PA3 of the first semiconductor chip 111. and may not vertically overlap the first part PA1 of the first semiconductor chip 111 at the first surface 113 thereof. The first molding layer 171 may be or include, for example, an epoxy molding compound (EMC).

The second semiconductor package 200 may be provided on the first semiconductor package 100. The second semiconductor package 200 may be vertically stacked on the first semiconductor package 100. The second semiconductor package 200 may include a second package substrate 201, one or more second semiconductor chips 211, second bonding wires 221, and a second molding layer 231.

The second package substrate 201 may be provided on the first semiconductor package 100. The second package substrate 201 may be or include, for example, a printed circuit board (PCB). Multiple second semiconductor chips 211 may be sequentially stacked on a top surface of the second package substrate 201. Adhesive layers 213 may be used to attach the second semiconductor chips 211 to the top surface of the second package substrate 201. The second bonding wires 221 may be provided between the second package substrate 201 and the second semiconductor chips 211. The second bonding wires 221 may electrically connect the second semiconductor chips 211 to the second package substrate 201.

The second molding layer 231 may be provided on the second package substrate 201. The second molding layer 231 may cover the second semiconductor chips 211 and the second bonding wires 221. The second molding layer 231 may be or include, for example, an epoxy molding compound (EMC). In an example embodiment, the second semiconductor package 200 may have a width W2 less than a width W1 of the first semiconductor package 100 (W2<W1).

The connection terminals 300 may be provided between the first semiconductor package 100 and the second semiconductor package 200. The connection terminals 300 may be disposed between the connection pads 151 and a bottom surface of the second package substrate 201, which bottom surface is opposite to the top surface of the second package substrate 201. The connection terminals 300 may be spaced apart from the first molding layer 171. The connection terminals 300 may be in contact with and connected to the connection pads 151. For example, the second semiconductor chips 211 may be connected to the first semiconductor chip 111 and/or the external terminals 109 through the connection terminals 300, the connection pads 151, the connection patterns 155, the first bonding wires 161, and the first package substrate 101.

According to an example embodiment, the connection terminals 300 may be provided on the connection pads 151 disposed on the first surface 113 serving as an inactive surface of the first semiconductor chip 111, and the first and second semiconductor packages 100 and 200 may be connected to each other through the connection terminals 300 and the connection pads 151, without any structures between the first and second semiconductor packages 100 and 200. Accordingly, the first semiconductor chip 111 may be increased in thickness, and the first semiconductor package 100 may have improved heat radiation.

In an example embodiment, the second semiconductor package 200 may be connected to the first semiconductor package 100 through the connection terminals 300, the connection pads 151, the connection patterns 155, and the first bonding wires 161, such that a number of signal terminals (e.g., bonding wires) may be provided without an increase in width of the first semiconductor package 100.

Figure 3:
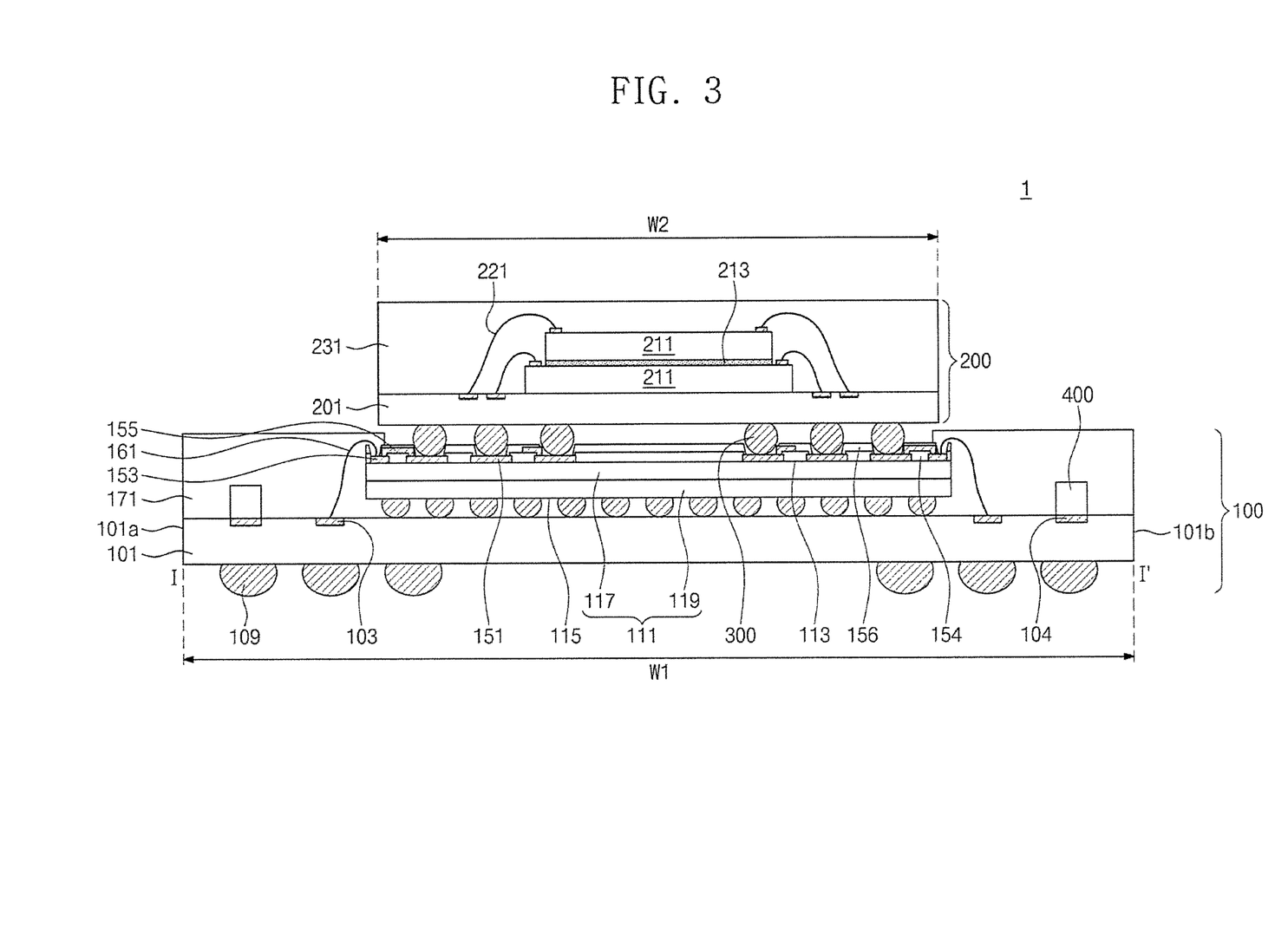
FIG. 3 illustrates a cross-sectional view showing a semiconductor package according to an example embodiment.

FIG. 3 illustrates a cross-sectional view showing a semiconductor package according to an example embodiment. In the embodiment that follows, technical features repetitive to those of the semiconductor package discussed above with reference to FIGS. 1 and 2 are omitted for brevity of description.

Referring to FIG. 3, a passive device 400 or multiple passive devices 400 may be disposed on the top surface of the first package substrate 101. The passive devices 400 may be connected to second pads 104 disposed on the top surface of the first package substrate 101. The passive devices 400 may include one or more selected from a resistor, a capacitor, an inductor, a thermistor, an oscillator, a ferrite bead, an antenna, a varistor, a crystal oscillator (X-TAL), or other passive devices. The passive devices 400 may, for example, act to filter signal noise and/or to increase signal processing speeds of an active device such as the first semiconductor chip 111. In an example embodiment, the first bonding wires 161 may help to secure a space for an edge of the first package substrate 101. The passive devices 400 may be disposed on the secured space on the edge of the first package substrate 101, which may result in improvement in electrical characteristics of the semiconductor package 1.

The first molding layer 171 may be disposed on the top surface of the first package substrate 101, and may cover the passive devices 400, the first bonding wires 161, and the side surfaces of the first semiconductor chip 111. As described above, the first molding layer 171 may vertically overlap the second and third parts PA2 and PA3 of the first semiconductor chip 111, and may not vertically overlap the first part PA1 of the first semiconductor chip 111 at the first surface 113 thereof. The first molding layer 171 may be spaced apart from the connection terminals 300. In an example embodiment, the top surface of the first molding layer 171 may be located at a level higher than that of the top surface of the second insulation layer 156. In an example embodiment, when a space is sufficiently provided between the first and second semiconductor packages 100 and 200, the second and third parts PA2 and PA3 of the first semiconductor chip 111 may not be recessed from the first surface 113 of the first part PA1 of the first semiconductor chip 111. In such cases, the first surface 113 of the first part PA1 of the first semiconductor chip 111 may be coplanar with the first surface 113 of each of the second and third parts PA2 and PA3 of the first semiconductor chip 111.

Figure 4:
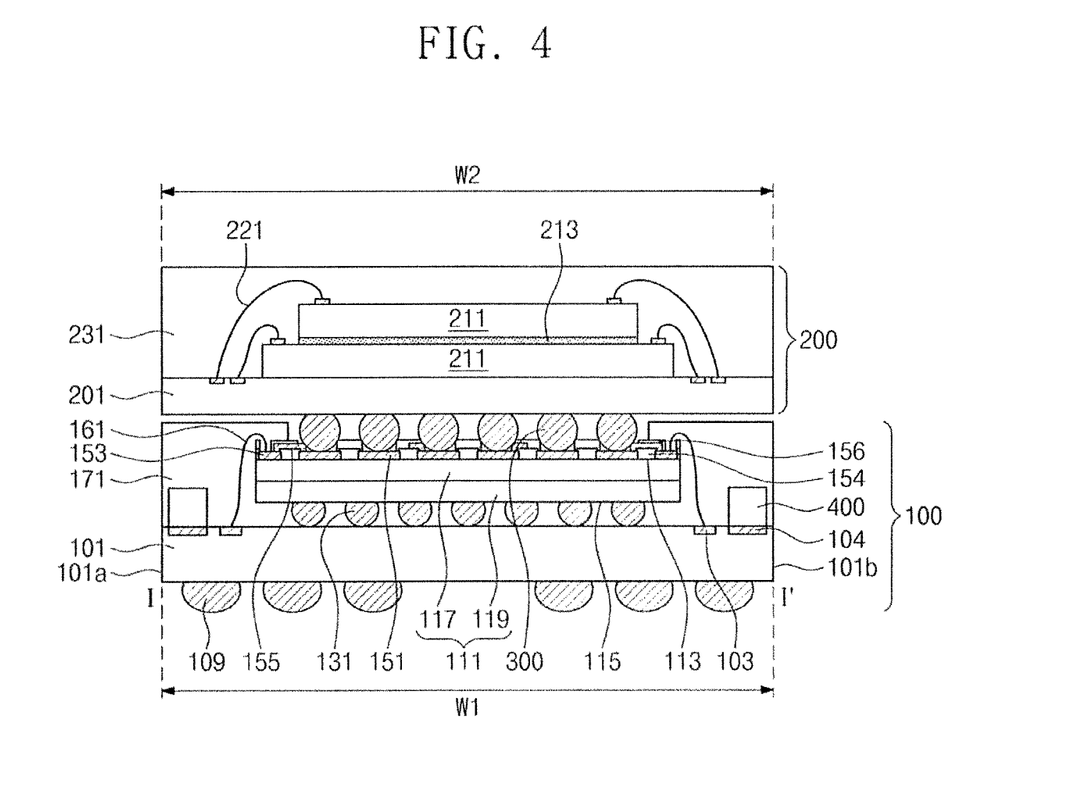
FIG. 4 illustrates a cross-sectional view showing a semiconductor package according to an example embodiment.

FIG. 4 illustrates a cross-sectional view showing a semiconductor package according to an example embodiment. In the description that follows, a description of technical features discussed above with reference to FIGS. 1, 2, and 3 may be omitted for brevity.

Referring to FIG. 4, according to an example embodiment, the width W1 of the first semiconductor package 100 may be the same as the width W2 of the second semiconductor package 200 (W1=W2).

Figure 5:
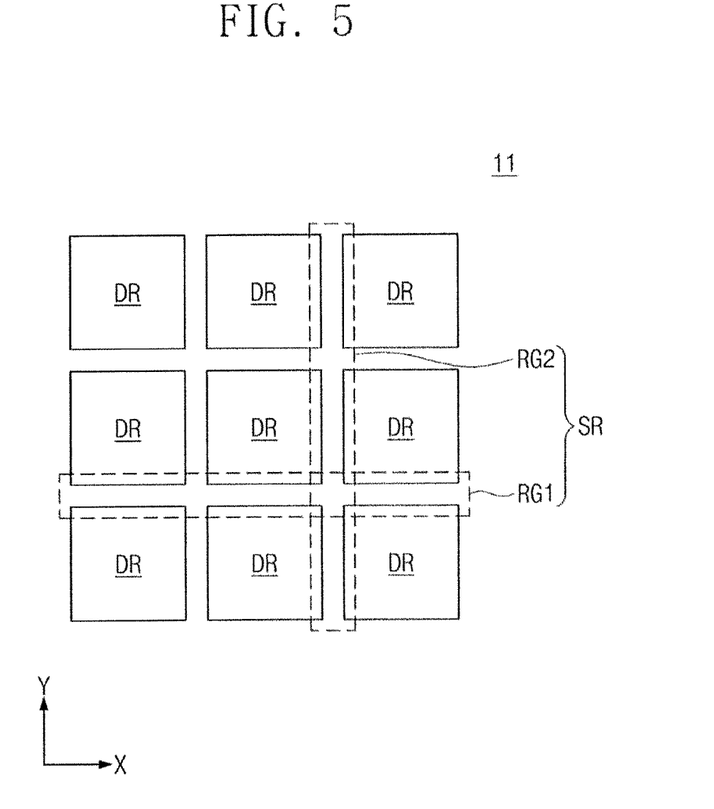
FIG. 5 illustrates a plan view partially showing a chip substrate according to an example embodiment.

FIG. 5 illustrates a plan view partially showing a chip substrate according to an example embodiment. FIGS. 6 to 10 illustrate cross-sectional views showing a method of fabricating a semiconductor package according to an example embodiment.

Figure 6:
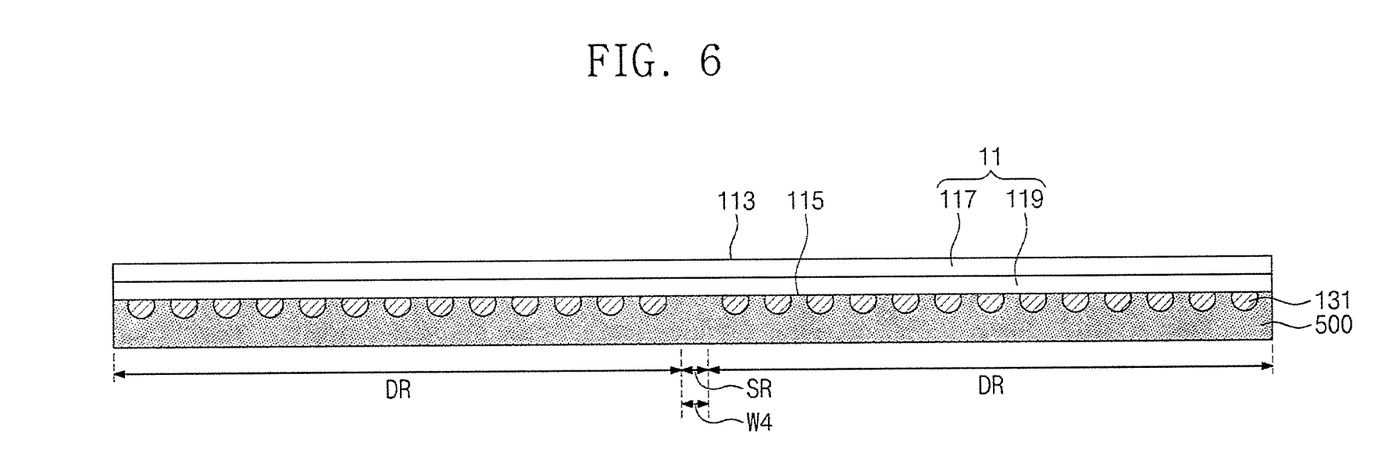
FIGS. 6 to 10 illustrate cross-sectional views showing a method of fabricating a semiconductor package according to an example embodiment.

Referring to FIGS. 5 and 6, a chip substrate 11 may be provided. The chip substrate 11 may include device zones DR and a scribe zone SR between the device zones DR. The scribe zone SR may include first sections RG1 extending in the first direction X and second sections RG2 extending in the second direction Y intersecting the first direction X. The chip substrate 11 may be cut along the scribe zone SR in a subsequent process. When the chip substrate 11 is cut, each of the device regions DR may be used as a semiconductor chip. Each of the second sections RG2 of the scribe zone SR may have a width W4. Each of the first sections RG1 of the scribe zone SR may have a width the same as or similar to the width W4.

The chip substrate 11 may include the semiconductor layer 117 and the integrated circuit structure 119. The semiconductor layer 117 may be or include a wafer or a bare wafer. The semiconductor layer 117 may be, for example, a silicon substrate, a germanium substrate, or a silicon-germanium substrate. The integrated circuit structure 119 may be disposed at a bottom surface of the semiconductor layer 117. The integrated circuit structure 119 may include dielectric layers stacked on the bottom surface of the semiconductor layer 117 and may include at least one transistor disposed on the bottom surface of the semiconductor layer 117. In an example embodiment, the chip substrate 11 may have the first surface 113 and the second surface 115 facing each other. The first surface 113 of the chip substrate 11 may correspond to the top surface of the semiconductor layer 117, and the second surface 115 of the chip substrate 11 may correspond to the bottom surface of the integrated circuit structure 119. The first surface 113 may correspond to an inactive surface of the chip substrate 11, and the second surface 115 may correspond to an active surface of the chip substrate 11.

The chip terminals 131 may be formed on the second surface 115 of the chip substrate 11. The chip terminals 131 may include, for example, one or more of copper (Cu), silver (Ag), platinum (Pt), aluminum (Al), and copper (Cu). The chip terminals 131 may be formed by, for example, a sputtering process, a plating process such as pulse plating or direct-current plating, a soldering process, or an attachment process. A support member 500 may be provided on the second surface 115 of the chip substrate 11. The support member 500 may cover the chip terminals 131. The support member 500 may be or include a wafer supporting system that handles the chip substrate 11. The support member 500 may include an adhesive material, for example, an epoxy, a silicon-based insulation layer, or a tape.

Figure 7:
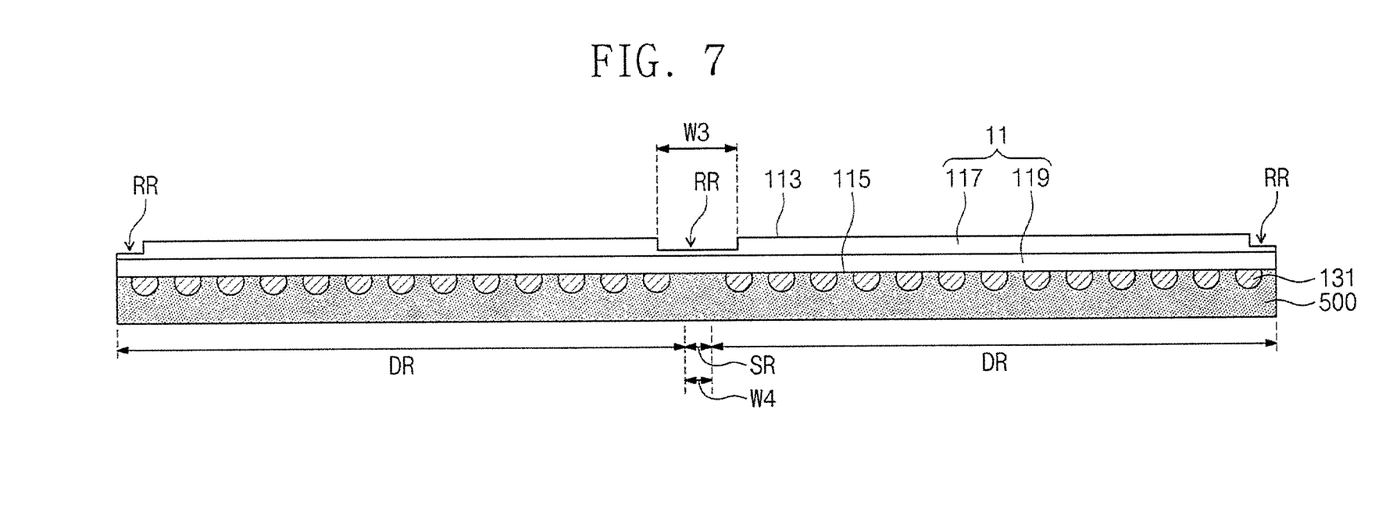

Referring to FIG. 7, recess regions RR may be formed in the chip substrate 11. The recess regions RR may be formed along the second sections RG2 of the scribe zone SR. The recess regions RR may not be formed on the first sections RG1 of the scribe zone SR. The recess regions RR may have floor surfaces each of which is closer to the second surface 115 of the chip substrate 11 than the first surface 113 of the device zones DR of the chip substrate 11 is. The recess regions RR may have a width W3 greater than the width W4 of the second sections RG2, or each of the first sections RG1, of the scribe zone SR (W3>W4).

In the formation of the recess regions RR, an etching process may be performed such that the first surface 113 of the chip substrate 11 is etched on the second sections RG2 of the scribe zone SR. The recess regions RR may be formed by, for example, a dry etching process or a laser etching process. In an implementation, the etching process may form the recess regions RR. The etching process for forming the recess regions RR may etch edge portions of the device zones DR of the chip substrate 11, which edge portions are adjacent to the second sections RG2 of the scribe zone SR. Each of the recess regions RR may thus expand toward side sides of the devices zones DR, which side sides adjoin the recess region RR and face each other in the first direction X.

Figure 8:
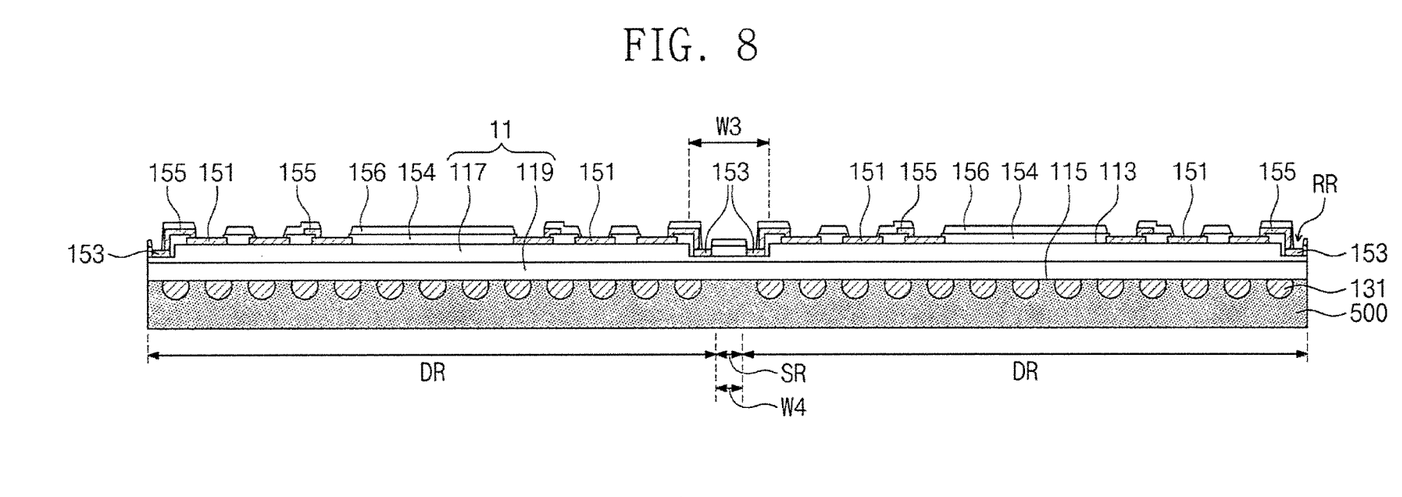

Referring to FIG. 8, the connection pads 151 and the bonding pads 153 may be formed on the first surface 113 of the chip substrate 11. The connection pads 151 may be formed on the first surface 113 of the device zones DR of the chip substrate 11, and the bonding pads 153 may be formed on the floor surfaces of the recess regions RR (i.e., on the first surface 113 of the recess regions RR). The formation of the connection pads 151 and the bonding pads 153 may include forming a metal layer on the first surface 113 of the chip substrate 11 and then patterning the metal layer.

The first insulation layer 154 may be formed on the first surface 113 of the chip substrate 11. The formation of the first insulation layer 154 may include forming an insulation layer on the first surface 113 of the chip substrate 11 and then patterning the insulation layer to expose the connection pads 151 and the bonding pads 153. The first insulation layer 154 may be formed of a single layer or a plurality of layers. The first insulation layer 154 may include, for example, one or more of a silicon oxide layer, a silicon nitride layer, and a silicon oxynitride layer.

The connection patterns 155 may be formed on the first insulation layer 154. The formation of the connection patterns 155 may include forming a metal layer on the first insulation layer 154 and then patterning the metal layer. The connection patterns 155 may connect the connection pads 151 to the bonding pads 153. Each of the connection patterns 155 may be formed of a single layer or a plurality of layers. Each of the connection patterns 155 may include, for example, one or more of aluminum (Al), nickel (Ni), and copper (Cu).

The second insulation layer 156 may be formed on the connection patterns 155. The formation of the second insulation layer 156 may include forming an insulation layer to cover the connection patterns 155 and the first insulation layer 154, and then patterning the insulation layer to expose the connection pads 151 and the bonding pads 153. The second insulation layer 156 may cover the first insulation layer 154 and the connection patterns 155. The second insulation layer 156 may be formed of a single layer or a plurality of layers. The second insulation layer 156 may include, for example, one or more of a silicon oxide layer, a silicon nitride layer, and a silicon oxynitride layer.

Figure 9:
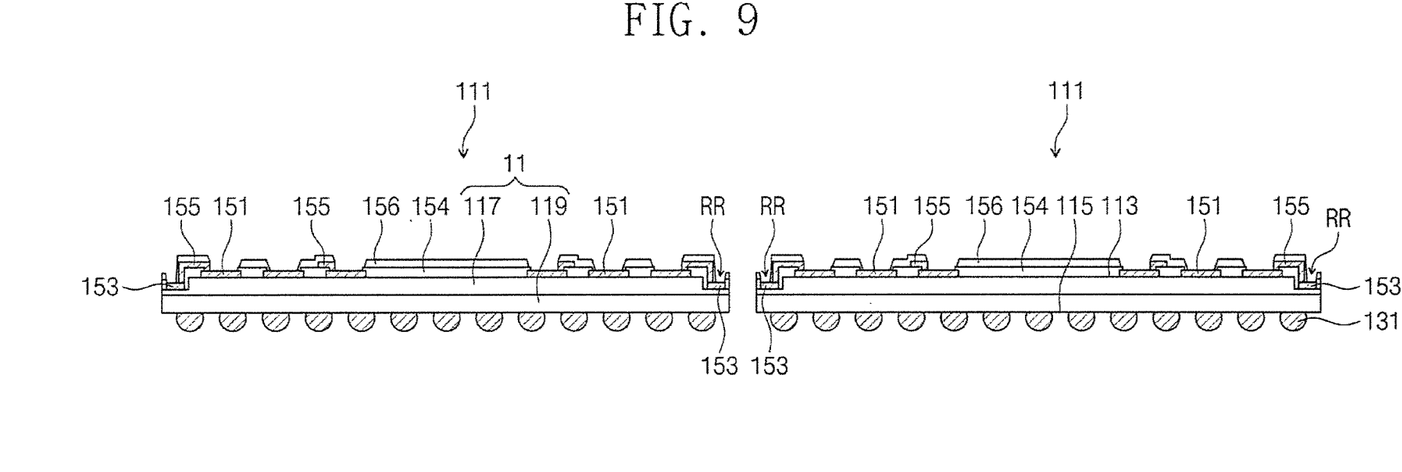

Referring to FIG. 9, a cutting process may be performed to cut the chip substrate 11. The cutting process may cut the chip substrate 11 along the scribe zone SR. The cutting process may sequentially cut the second insulation layer 156 formed on the scribe zone SR of the chip substrate 11, the first insulation layer 154 formed on the scribe zone SR of the chip substrate 11, the chip substrate 11, and the support member 500 formed on the scribe zone SR of the chip substrate 11. The cutting process may separate the chip substrate 11 into a plurality of first semiconductor chips 111. In an example embodiment, the first semiconductor chips 111 may be semiconductor logic chips.

The support member 500 covering the chip terminals 131 may be removed after the cutting process. In another implementation, the support member 500 may be removed before the cutting process.

Figure 10:
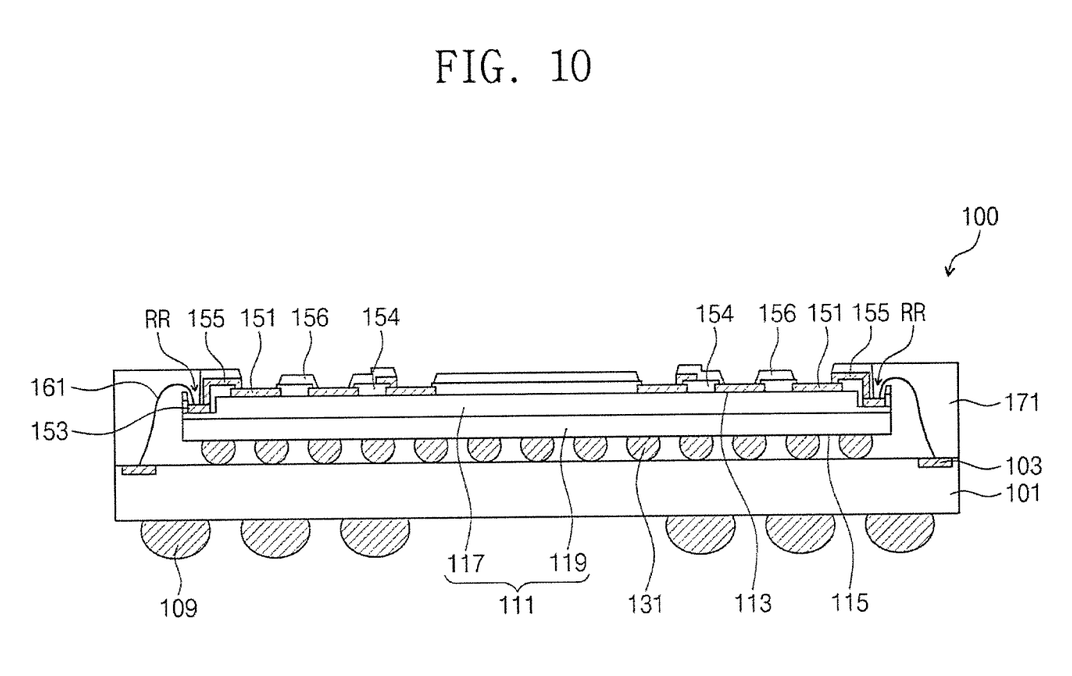

Referring to FIG. 10, the first package substrate 101 may be prepared. The first package substrate 101 may be or include, for example, a printed circuit board (PCB). The first package substrate 101 may include the first pads 103, which may be disposed on a top surface of the first package substrate 101. The external terminals 109 may be formed on a bottom surface of the first package substrate 101, which bottom surface is opposite to the top surface of the first package substrate 101. The external terminals 109 may include, for example, solder balls or solder bumps.

At least one of the first semiconductor chips 111 may be mounted on the first package substrate 101. The chip terminals 131 may be disposed on the top surface of the first package substrate 101. The first semiconductor chip 111 may be flip-chip bonded to the first package substrate 101. The first bonding wires 161 may be formed to lie between and electrically connect the bonding pads 153 and the first pads 103. The first bonding wires 161 may include, for example, gold (Au).

The first molding layer 171 may be formed on the first package substrate 101. The formation of the first molding layer 171 may include providing on a top surface of the second insulation layer 156 a mold frame parallel to the first package substrate 101, and then filling a molding material into a space between the mold frame and the first package substrate 101. The first molding layer 171 may fill a space between the first package substrate 101 and the second surface 115 of the first semiconductor chip 111, while covering the first bonding wires 161, the bonding pads 153, and side surfaces of the first package substrate 101. For example, the first molding layer 171 may have a top surface coplanar with the top surface of the second insulation layer 156. For another example, the top surface of the first molding layer 171 may be higher than the top surface of the second insulation layer 156. The first molding layer 171 may include, for example, an insulating polymeric material such as an epoxy molding compound.

The first semiconductor package 100 may be fabricated through the processes discussed above with reference to FIGS. 6 to 10. The following will now describe the fabrication of a second semiconductor package (see 200 of FIG. 2), and a semiconductor package (see 1 of FIG. 2) that includes the first semiconductor package 100 and the second semiconductor package 200.

Referring back to FIG. 2, the second semiconductor package 200 may be fabricated. The second semiconductor package P200 may include the second package substrate 201, the second semiconductor chips 211, and the second molding layer 231. The second package substrate 201 may be or include, for example, a printed circuit board (PCB). The second semiconductor chips 211 may be mounted on a top surface of the second package substrate 201. The adhesive layers 213 may be used to attach the second semiconductor chips 211 to the top surface of the second package substrate 201. The second semiconductor chips 211 may be, for example, semiconductor memory chips.

The second bonding wires 221 may be formed to connect the second semiconductor chips 211 to the second package substrate 201. The second bonding wires 221 may include, for example, gold (Au). The second molding layer 231 may be formed on the second package substrate 201. The second molding layer 231 may cover the second semiconductor chips 211, the second bonding wires 221, and the top surface of the second package substrate 201. The second molding layer 231 may include, for example, an insulating polymeric material such as an epoxy molding compound.

The connection terminals 300 may be disposed at a bottom surface of the second package substrate 201, which bottom surface is opposite to the top surface of the second package substrate 201. The connection terminals 300 may be disposed on the connection pads 151.

The connection terminals 300 may be formed by a soldering process performed on the top surface of the second package substrate 201. In another implementation, the connection terminals 300 may be formed on the connection pads 151. For example, a soldering process for forming the connection terminals 300 may be performed on the connection pads 151.

The first semiconductor package 100 may be mounted on the second semiconductor package 200 on which the connection terminals 300 are formed. The mounting of the second semiconductor package 200 on the first semiconductor package 100 may fabricate the semiconductor package 1. The semiconductor package 1 may be a package-on-package (POP) type.

As described above, embodiments relate to a semiconductor package with improved electrical characteristics.

According to an example embodiment, connection terminals between vertically stacked first and second semiconductor packages may be provided on connection pads disposed on an inactive surface of a first semiconductor chip included in the first semiconductor package. The first and second semiconductor packages may be connected to each other through the connection terminals and the connection pads, without any structures between the first and second semiconductor packages. Accordingly, the first semiconductor chip may be increased in thickness, and the first semiconductor package may provide improved heat radiation.

According to an example embodiment, the second semiconductor package may be connected to the first semiconductor package through the connection terminals, the connection pads, and bonding wires between a first package substrate and the inactive surface of the first semiconductor chip. Therefore, a number of signal terminals (e.g., bonding wires) may be provided without an increase in width of the first semiconductor package, and as a result, a semiconductor package may improve in electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a first semiconductor package;
a second semiconductor package on the first semiconductor package; and
a plurality of connection terminals between the first semiconductor package and the second semiconductor package, wherein:
the first semiconductor package includes:
a package substrate;
a semiconductor chip on the package substrate and having a first surface and a second surface facing each other, the first surface being adjacent to the second semiconductor package;
a plurality of connection pads between the first surface of the semiconductor chip and the connection terminals; and
a molding layer on the package substrate and covering side surfaces of the semiconductor chip, the molding layer being spaced apart from the connection terminals, and
the semiconductor chip includes:
a first part on which the connection pads are disposed; and
a second part between the first part and a side surface of the semiconductor chip, the second part of the semiconductor chip being recessed from the first surface of the first part of the semiconductor chip.

2. The semiconductor package as claimed in claim 1, wherein the first semiconductor package further includes a plurality of chip terminals between the package substrate and the second surface of the semiconductor chip.

3. The semiconductor package as claimed in claim 1, wherein the first semiconductor package further includes a plurality of bonding wires between the package substrate and the first surface of the semiconductor chip, the bonding wires being disposed on the second part of the semiconductor chip.

4. The semiconductor package as claimed in claim 1, wherein the first semiconductor package further includes a plurality of bonding wires between the package substrate and the first surface of the semiconductor chip, the molding layer covering the bonding wires.

5. The semiconductor package as claimed in claim 1, wherein the connection terminals are in contact with the connection pads.

6. The semiconductor package as claimed in claim 1, wherein the first semiconductor package further includes:
  a plurality of bonding wires between the package substrate and the first surface of the semiconductor chip; and
  a plurality of connection patterns on the first surface of the semiconductor chip and connecting the connection pads to the bonding wires.

7. The semiconductor package as claimed in claim 1, wherein the first semiconductor package further includes a passive device on the package substrate.

8. The semiconductor package as claimed in claim 1, wherein the first semiconductor package further includes an insulation layer on the first surface of the semiconductor chip, the insulation layer exposing the connection pads, a top surface of the molding layer being coplanar with a top surface of the insulation layer.

9. The semiconductor package as claimed in claim 1, wherein the first semiconductor package further includes an insulation layer on the first surface of the semiconductor chip, the insulation layer exposing the connection pads, a top surface of the molding layer being located at a level higher than that of a top surface of the insulation layer.

10. The semiconductor package as claimed in claim 1, wherein the second semiconductor package has a width the same as or less than a width of the first semiconductor package.

11. The semiconductor package as claimed in claim 1, wherein:
  the first surface of the semiconductor chip is an inactive surface, and
  the second surface of the semiconductor chip is an active surface.

12. A semiconductor package, comprising:
  a first semiconductor package;
  a second semiconductor package on the first semiconductor package; and
  a plurality of connection terminals between the first semiconductor package and the second semiconductor package, wherein:
  the first semiconductor package includes:
    a package substrate;
    a semiconductor chip on the package substrate and having a first surface and a second surface facing each other;
    a plurality of chip terminals between the package substrate and the second surface of the semiconductor chip; and
    a plurality of connection pads between the first surface of the semiconductor chip and the connection terminals, and
  the semiconductor chip includes:
    a first part on which the connection pads are disposed; and
    a second part between the first part and a side surface of the semiconductor chip, the second part of the semiconductor chip being recessed from the first surface of the first part of the semiconductor chip.

13. The semiconductor package as claimed in claim 12, wherein the connection pads are spaced apart from each other in a first direction and a second direction intersecting each other.

14. The semiconductor package as claimed in claim 12, wherein the first semiconductor package further includes a molding layer on the package substrate and covering side surfaces of the semiconductor chip, the molding layer being spaced apart from the connection terminals.

15. The semiconductor package as claimed in claim 12, wherein the first semiconductor package further includes a plurality of bonding wires between the package substrate and the first surface of the semiconductor chip, the bonding wires being disposed on the second part of the semiconductor chip.

16. The semiconductor package as claimed in claim 12, wherein:
  the first semiconductor package further includes a molding layer that covers side surfaces of the semiconductor chips,
  the molding layer does not overlap the first part, and
  the molding layer overlaps the second part.

17. The semiconductor package as claimed in claim 12, wherein the first semiconductor package further includes a plurality of connection patterns on the first surface of the semiconductor chip, the connection patterns being disposed to correspond to the connection pads.

18. The semiconductor package as claimed in claim 12, wherein the first semiconductor package further includes:
  a molding layer that covers side surfaces of the semiconductor chip; and
  an insulation layer on the first surface of the semiconductor chip and exposing the connection pads, a top surface of the molding layer being coplanar with a top surface of the insulation layer.

19. The semiconductor package as claimed in claim 12, wherein
  the first surface of the semiconductor chip is an inactive surface, and
  the second surface of the semiconductor chip is an active surface.

20. A semiconductor package, comprising:
  a first semiconductor package;
  a second semiconductor package on the first semiconductor package; and
  a plurality of connection terminals between the first semiconductor package and the second semiconductor package, wherein:
  the first semiconductor package includes:
    a package substrate;
    a semiconductor chip on the package substrate and having a first surface and a second surface facing each other, the first surface being adjacent to the second semiconductor package;

a plurality of connection pads between the first surface of the semiconductor chip and the connection terminals;

a molding layer on the package substrate and covering side surfaces of the semiconductor chip, the molding layer being spaced apart from the connection terminals;

a plurality of bonding wires between the package substrate and the first surface of the semiconductor chip; and a plurality of connection patterns on the first surface of the semiconductor chip and connecting the connection pads to the bonding wires.

\* \* \* \* \*